(12) United States Patent
Wu (10) Patent No.: US 10,200,034 B2
(45) Date of Patent: Feb. 5, 2019

(54) PHOTOELECTRIC SWITCH

(71) Applicant: Fuxi Wu, Dongguan (CN)

(72) Inventor: Fuxi Wu, Dongguan (CN)

(73) Assignee: Dongguan City Kaihua Electronics Co., Ltd., Dongguan (CN)

( * ) Notice: Subject to any disclaimer, the term of this patent is extended or adjusted under 35 U.S.C. 154(b) by 0 days.

(21) Appl. No.: 15/486,269

(22) Filed: Apr. 12, 2017

(65) Prior Publication Data

US 2017/0222646 A1 Aug. 3, 2017

Related U.S. Application Data

(63) Continuation-in-part of application No. PCT/CN2015/091845, filed on Oct. 13, 2015.

(30) Foreign Application Priority Data

Oct. 13, 2014 (CN) .......................... 2014 1 0536104

(51) Int. Cl.
*H03K 17/96* (2006.01)
*G06F 3/02* (2006.01)
*H03K 17/968* (2006.01)
*H01H 3/12* (2006.01)

(52) U.S. Cl.
CPC ....... *H03K 17/9638* (2013.01); *G06F 3/0202* (2013.01); *H03K 17/968* (2013.01); *H03K 17/9627* (2013.01); *H01H 3/125* (2013.01)

(58) Field of Classification Search
CPC .......................... H03K 17/9638; G06F 3/0202
USPC ....................................................... 250/347
See application file for complete search history.

(56) References Cited

U.S. PATENT DOCUMENTS

| | | | |
|---|---|---|---|
| 9,838,006 B2* | 12/2017 | Chen | H03K 17/78 |
| 2003/0052257 A1* | 3/2003 | Sumriddetchkajorn | |
| | | | H03K 17/9631 |
| | | | 250/227.11 |
| 2007/0273560 A1* | 11/2007 | Hua | G06F 3/0202 |
| | | | 341/33 |
| 2012/0075125 A1* | 3/2012 | Miwa | G06F 1/1669 |
| | | | 341/22 |
| 2015/0061901 A1* | 3/2015 | Casparian | H01H 13/83 |
| | | | 341/22 |
| 2017/0019102 A1* | 1/2017 | Chen | H03K 17/78 |

(Continued)

*Primary Examiner* — David Porta
*Assistant Examiner* — Gisselle Gutierrez
(74) *Attorney, Agent, or Firm* — Matthias Scholl P.C.; Matthias Scholl (57) ABSTRACT

A photoelectric switch, including: a base, an infrared tube, a keycap, a balance frame, a resetting mechanism, and a light-blocking member. The light-blocking member is configured to change the propagation direction of light emitted from the infrared tube to allow or block the light propagation in the infrared tube. The infrared tube is disposed on the base. The infrared tube includes a light-emitting end and a light-receiving end. The infrared tube, the balance frame, and the resetting mechanism are disposed beneath and covered by the keycap. In operation, upon being pressed by an external force, the balance frame leads the keycap to move downwards smoothly; the light-blocking member moves upwards or downwards along with the motion of the keycap and the balance frame or the resetting mechanism. The resetting mechanism is configured to reset the keycap or the balance frame.

6 Claims, 14 Drawing Sheets

(56) References Cited

U.S. PATENT DOCUMENTS

2017/0115747 A1\* 4/2017 Chen .................... H03K 17/969
2017/0222646 A1\* 8/2017 Wu ...................... H03K 17/6871

\* cited by examiner

PHOTOELECTRIC SWITCH

CROSS-REFERENCE TO RELATED APPLICATIONS

This application is a continuation-in-part of International Patent Application No. PCT/CN2015/091845 with an international filing date of Oct. 13, 2015, designating the United States, now pending, and further claims foreign priority benefits to Chinese Patent Application No. 201410536104.4 filed Oct. 13, 2014. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, and Cambridge, Mass. 02142.

BACKGROUND OF THE INVENTION

Field of the Invention

The invention relates to an ultrathin photoelectric switch.

Description of the Related Art

Typically, keyboard switches include a movable contact piece, a static contact piece, a keycap, and a button. The button often presents in the form of a guide pin, which has a relatively large thickness, leading to high material consumption. The button is disposed at the bottom center of the keycap. When the edge of the keycap is pressed, the button cannot move downward smoothly and steadily, so the contact and conduction between the movable contact piece and the static contact piece are unreliable. In addition, both the movable contact piece and the static contact piece are metals, which tend to be oxidized, causing bad contact.

SUMMARY OF THE INVENTION

In view of the above-described problems, it is one objective of the invention to provide a photoelectric switch that is ultrathin, in which the contact and conduction between the movable contact piece and the static contact piece are stable and reliable.

To achieve the above objective, in accordance with one embodiment of the invention, there is provided an ultrathin photoelectric switch capable of stable switching, comprising a base, an infrared tube, a keycap, a balance frame, a resetting mechanism, and a light-blocking member. The light-blocking member is configured to change a propagation direction of light emitted from the infrared tube to allow or block light propagation in the infrared tube. The infrared tube is disposed on the base. The infrared tube comprises a light-emitting end and a light-receiving end. The infrared tube, the balance frame, and the resetting mechanism are disposed beneath and covered by the keycap. In operation, upon being pressed by an external force, the balance frame leads the keycap to move downwards smoothly; the light-blocking member moves upwards or downwards along with the motion of the keycap and the balance frame or the resetting mechanism. The resetting mechanism is configured to reset the keycap or the balance frame.

In a class of this embodiment, the base comprises a support body. The infrared tube and the support body are disposed on the base separately. On the base, an upper end of the support body is provided with a fulcrum slot. The balance frame comprises a first frame and a second frame. The first frame and the second frame are crisscrossed and articulated; a lower end of the first frame and a lower end of the second frame are respectively articulated with two ends of the base; an upper end of the first frame and an upper end of the second frame are respectively articulated with two ends of a bottom of the keycap; the resetting mechanism comprises an overturning member and a tension spring; one end of the overturning member butts against the fulcrum slot; the overturning member is capable of turning over relative to the support body; one end of the tension spring is connected to the other end of the overturning member, and the other end of the tension spring is connected to the upper end of the first frame.

In a class of this embodiment, the light-blocking member is formed by extension of the overturning member and is integrated with the overturning member.

In a class of this embodiment, the light-blocking member is a protrusion of the bottom of the keycap and is integrated with the keycap.

In a class of this embodiment, the light-blocking member is a protrusion of the balance frame and is integrated with the balance frame.

In a class of this embodiment, the infrared tube is a refractive infrared tube; the light-emitting end and the light-receiving end are encapsulated in a main body; and the light-blocking member is disposed above the main body and is capable of moving up and down.

In a class of this embodiment, the infrared tube is a correlative infrared tube; the infrared tube comprises a light-emitting tube and light-receiving tube; the light-emitting end is disposed on the light-emitting tube, and the light-receiving end is disposed on the light-receiving tube; and the light-blocking member is disposed between the light-emitting tube and the light-receiving tube and is capable of moving up and down.

Advantages of the ultrathin photoelectric switch according to embodiments of the invention are summarized as follows:

The light-blocking member is used to change the propagation direction of the light and control the connection and disconnection of the infrared tube. Conventional methods that the movable contact piece is connected to the static contact piece are replaced, thus the bad contact caused by oxidization of the contact pieces is effectively avoided. The stability of the switching is improved, and the service life of the photoelectric switch is prolonged. The balance frame is used to equalize compression on the keycap. The light-blocking member is driven by the keycap, the balance frame, and the resetting mechanism, and the conventional guide pin which is thick is abandoned, thus the photoelectric switch is thin. In addition, no matter which place the finger of users presses on the keycap, the balance frame can equalize the compression on the keycap through linkage control, thus the motion of the light-blocking member is accurate and sensitive, so the photoelectric switch is easy to use.

BRIEF DESCRIPTION OF THE DRAWINGS

The invention is described hereinbelow with reference to the accompanying drawings, in which.

In the drawings, the following reference numbers are used: 10. Base; 20. Infrared tube; 21. Light-emitting end; 22. Light-receiving end; 23. Main body; 24. Light-emitting tube; 25. Light-receiving tube; 30. Keycap; 40. Balance frame; 41. First frame; 42. Second frame; 50. Resetting mechanism; 51. Overturning member; 52. Tension spring; 60. Light-blocking member; 70. Support body; and 71. Fulcrum slot.

DETAILED DESCRIPTION OF THE EMBODIMENTS

For further illustrating the invention, experiments detailing an ultrathin photoelectric switch capable of stable switching are described below. It should be noted that the following examples are intended to describe and not to limit the invention.

Example 1

Figure 1:
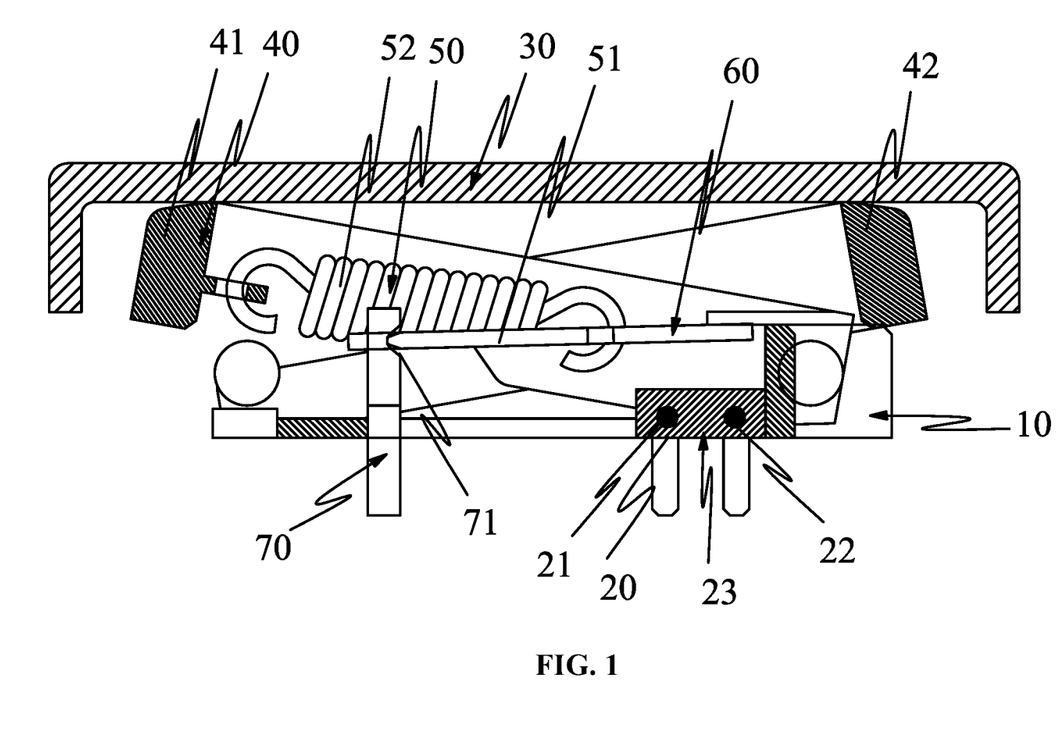
FIG. 1 is a schematic diagram of an ultrathin photoelectric switch in the off state in Example 1.
Figure 2:
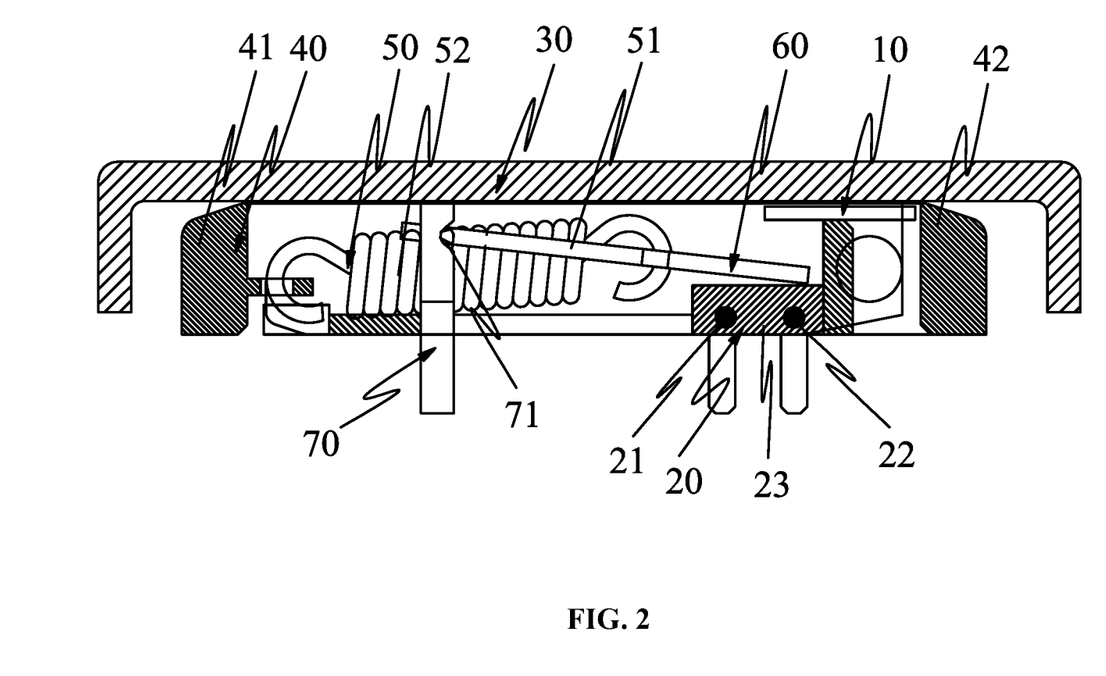
FIG. 2 is a schematic diagram of an ultrathin photoelectric switch in the on state in Example 1.

As shown in FIGS. 1-2, an ultrathin photoelectric switch capable of stable switching comprises a base 10, an infrared tube 20, a keycap 30, a balance frame 40, a resetting mechanism 50, and a light-blocking member 60.

The base 10 comprises a support body 70. The infrared tube 20 and the support body 70 are disposed on the base 10 separately. On the base, an upper end of the support body 70 is provided with a fulcrum slot 71.

The infrared tube 20 comprises a light-emitting end 21 and a light-receiving end 22. In the example, the infrared tube 20 is a refractive infrared tube. The light-emitting end 21 and the light-receiving end 22 are encapsulated in a main body 23.

The balance frame 40 comprises a first frame 41 and a second frame 42. The first frame 41 and the second frame 42 are crisscrossed and articulated. A lower end of the first frame 41 and a lower end of the second frame 42 are respectively articulated with two ends of the base 10. An upper end of the first frame 41 and an upper end of the second frame 42 are respectively articulated with two ends of a bottom of the keycap 30. The first frame 41 and the second frame 42 form an X-shaped structure.

The resetting mechanism 50 is configured to reset the keycap 30 or the balance frame 40. In the example, the resetting mechanism 50 operates to reset the balance frame 40, so as to reset the keycap 30. Specifically, in the example, the resetting mechanism 50 comprises an overturning member 51 and a tension spring 52. One end of the overturning member 51 butts against the fulcrum slot 71. The overturning member 51 is capable of turning over relative to the support body 70. One end of the tension spring 52 is connected to the other end of the overturning member 51, and the other end of the tension spring is connected to the upper end of the first frame 41.

The keycap 30 covers the infrared tube 20. The balance frame 40 and the resetting mechanism 50 are disposed beneath the keycap 30. The balance frame 40 is configured to equalize compression on the keycap 30. The light-blocking member 60 is configured to change a propagation direction of light emitted from the infrared tube 20 and control the connection and disconnection of the infrared tube 20. The keycap 30, the balance frame 40, or the resetting mechanism 50 drives the light-blocking member 60 to move up and down. In the example, the light-blocking member 60 is capable of moving up and down above the main body 23, and the light-blocking member 60 is formed by extension of the overturning member 51 and is integrated with the overturning member 51.

In use, as shown in FIG. 1, the light-blocking member 60 is disposed above the infrared tube 20. The infrared radiation emitted from the light-emitting end 21 is not received by the light-receiving end 22, and the photoelectric switch is in the off state. As shown in FIG. 2, when the keycap 30 is pressed, the first frame 41 and the second frame 42 move downwards and overlap, meanwhile, the tension spring 52 is stretched, and the overturning member 51 is turned downwards, thus the light-blocking member 60 is turned downwards and is close to the infrared tube 20. The infrared radiation emitted from the light-emitting end 21 is reflected by the light-blocking member 60 and radiates to the light-receiving end 22. The light-receiving end 22 receives the infrared radiation, and the photoelectric switch is switched-on. When the keycap 30 is released, the tension spring 52 restores, and due to the restoration of the tension spring 52, the first frame 41 and the second frame 42 moves upwards, meanwhile, the keycap 30 and the light-blocking member 60 are reset. The infrared radiation emitted from the light-emitting end 21 can no longer be received by the light-receiving end 22, the photoelectric switch is in the off state once again.

Example 2

Figure 3:
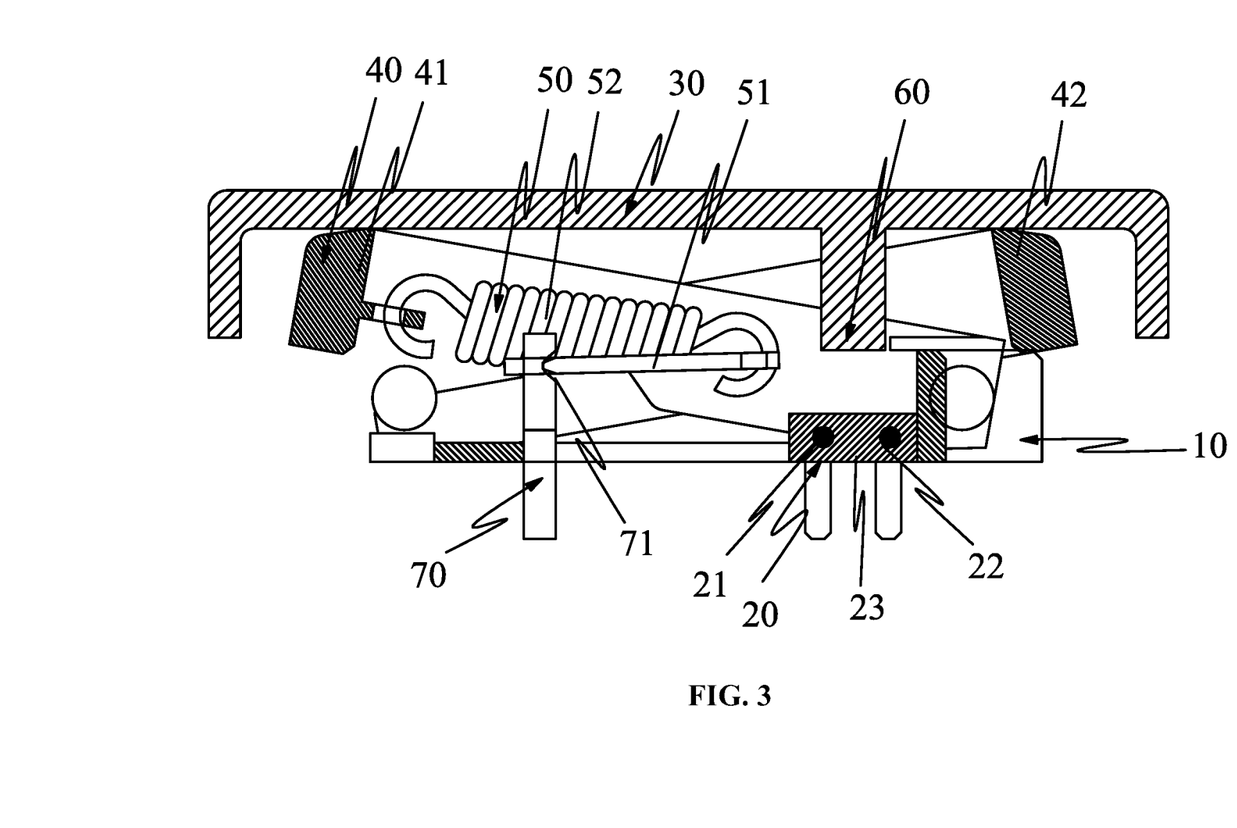
FIG. 3 is a schematic diagram of an ultrathin photoelectric switch in the off state in Example 2.
Figure 4:
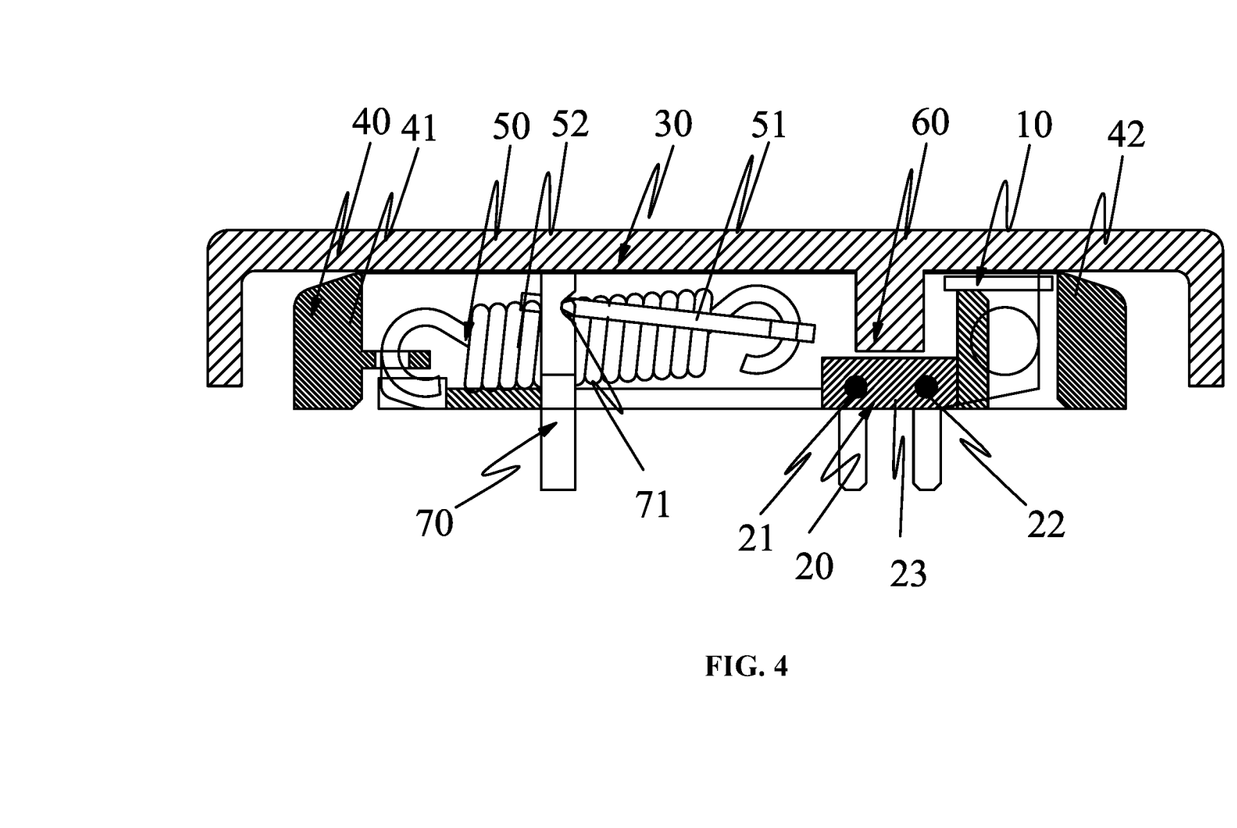
FIG. 4 is a schematic diagram of an ultrathin photoelectric switch in the on state in Example 2.

As shown in FIGS. 3-4, the example follows a basic structure in Example 1, except that in the example, the light-blocking member 60 is a protrusion of the bottom of the keycap 30 and is integrated with the keycap 30.

In use, as shown in FIG. 3, the light-blocking member 60 is disposed above the infrared tube 20. The infrared radiation emitted from the light-emitting end 21 is not received by the light-receiving end 22, and the photoelectric switch is in the off state. As shown in FIG. 4, when the keycap 30 is pressed, the first frame 41 and the second frame 42 move downwards and overlap, meanwhile, the tension spring 52 is stretched, and the overturning member 51 is turned downwards. The light-blocking member 60 also moves downwards with the keycap 30 and is close to infrared tube 20. The infrared radiation emitted from the light-emitting end 21 is reflected by the light-blocking member 60 and radiates to the light-receiving end 22. The light-receiving end 22 receives the infrared radiation, and the photoelectric switch is switched-on. When the keycap 30 is released, the tension spring 52 restores, and due to the restoration of the tension spring 52, the first frame 41 and the second frame 42 moves upwards, meanwhile, the keycap 30 is reset, and the light-blocking member 60 are reset together with the keycap 30. The infrared radiation emitted from the light-emitting end 21 can no longer be received by the light-receiving end 22, the photoelectric switch is in the off state once again.

Example 3

Figure 5:
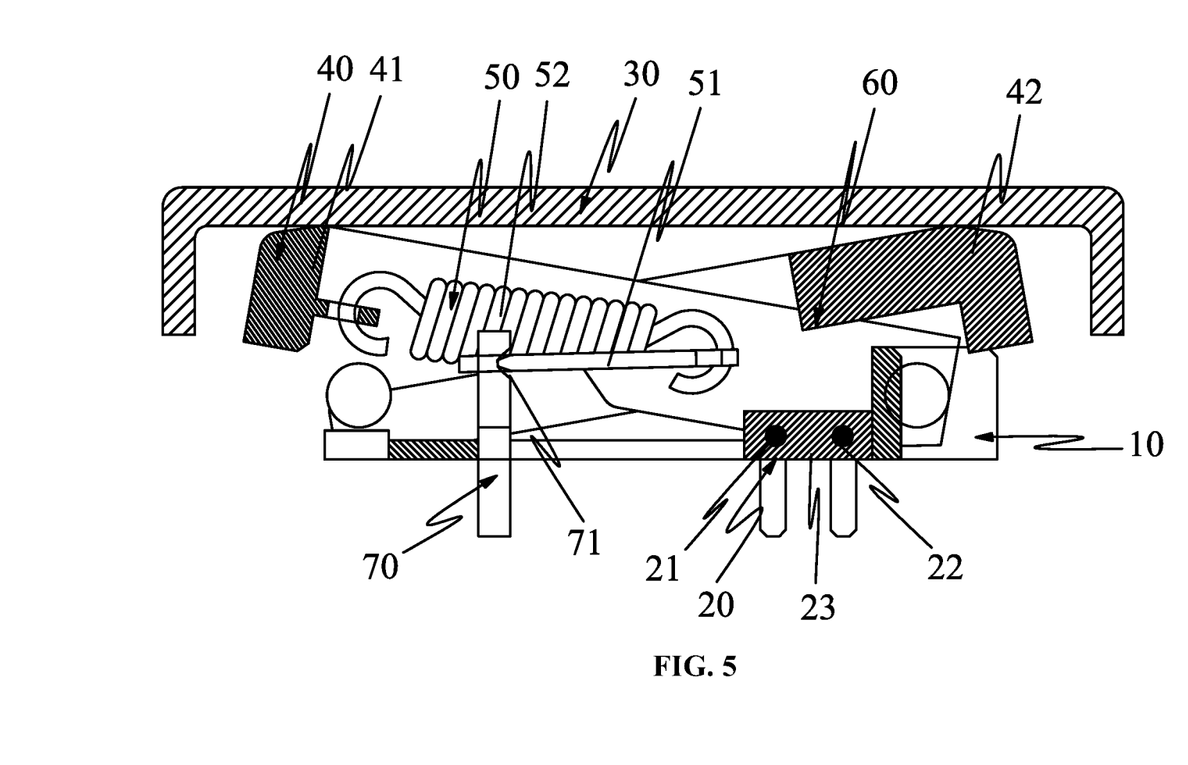
FIG. 5 is a schematic diagram of an ultrathin photoelectric switch in the off state in Example 3.
Figure 6:
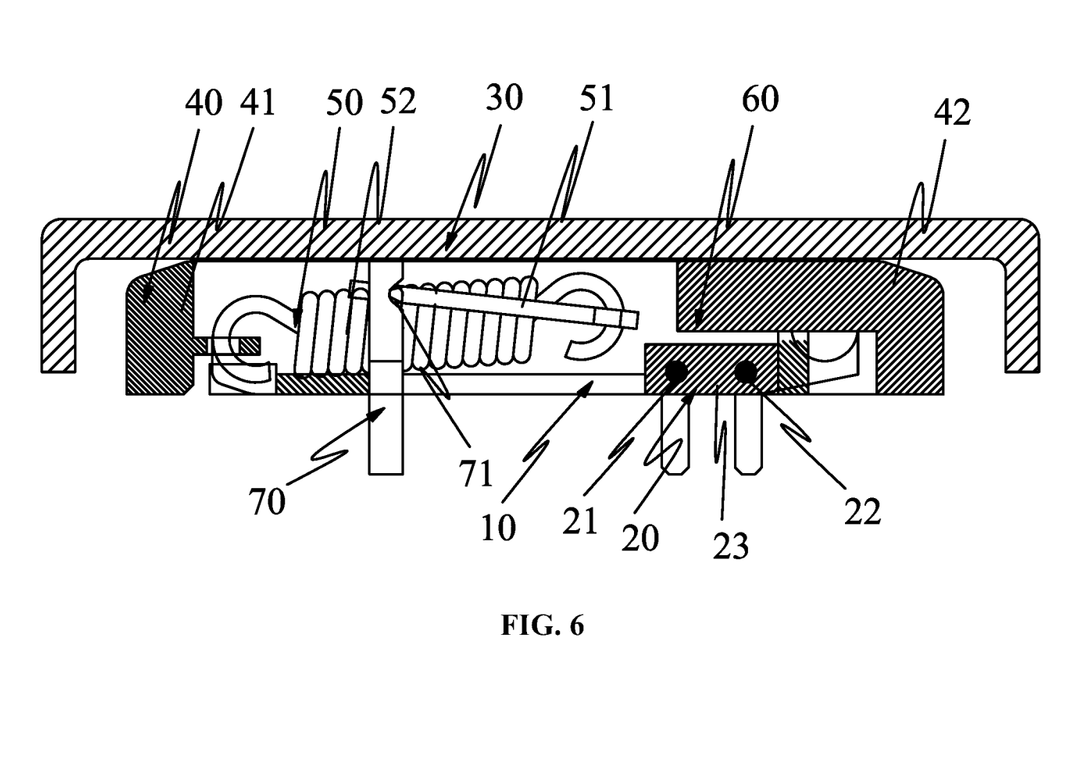
FIG. 6 is a schematic diagram of an ultrathin photoelectric switch in the on state in Example 3.

As shown in FIGS. 5-6, the example follows a basic structure in Example 1, except that in the example, the light-blocking member 60 is a protrusion of the balance frame 40 and is integrated with the balance frame 40.

In use, as shown in FIG. 5, the light-blocking member 60 is disposed above the infrared tube 20. The infrared radiation emitted from the light-emitting end 21 is not received by the light-receiving end 22, the photoelectric switch is in the off state. As shown in FIG. 6, when the keycap 30 is pressed, the first frame 41 and the second frame 42 move downwards and overlap, meanwhile, the tension spring 52 is stretched, and the overturning member 51 is turned downwards. The light-blocking member 60 also moves downwards with the balance frame 40 and is close to infrared tube 20. The infrared radiation emitted from the light-emitting end 21 is reflected by the light-blocking member 60 and radiates to the light-receiving end 22. The light-receiving end 22 receives the infrared radiation, and the photoelectric switch is switched-on. When the keycap 30 is released, the tension spring 52 restores, and due to the restoration of the tension spring 52, the first frame 41 and the second frame 42 moves upwards, meanwhile, the keycap 30 is reset, and the light-blocking member 60 are reset together with the balance frame 40. The infrared radiation emitted from the light-emitting end 21 can no longer be received by the light-receiving end 22, the photoelectric switch is in the off state once again.

Example 4

As shown in FIGS. 7-10, the example follows a basic structure in Example 1, except that the infrared tube 20 in the example is a correlative infrared tube, and comprises a light-emitting tube 24 and a light-receiving tube 25. The light-emitting end 21 is disposed on the light-emitting tube 24, and the light-receiving end 22 is disposed on the light-receiving tube 25. The light-blocking member 60 is capable of moving up and down between the light-emitting tube 24 and the light-receiving tube 25.

Figure 7:
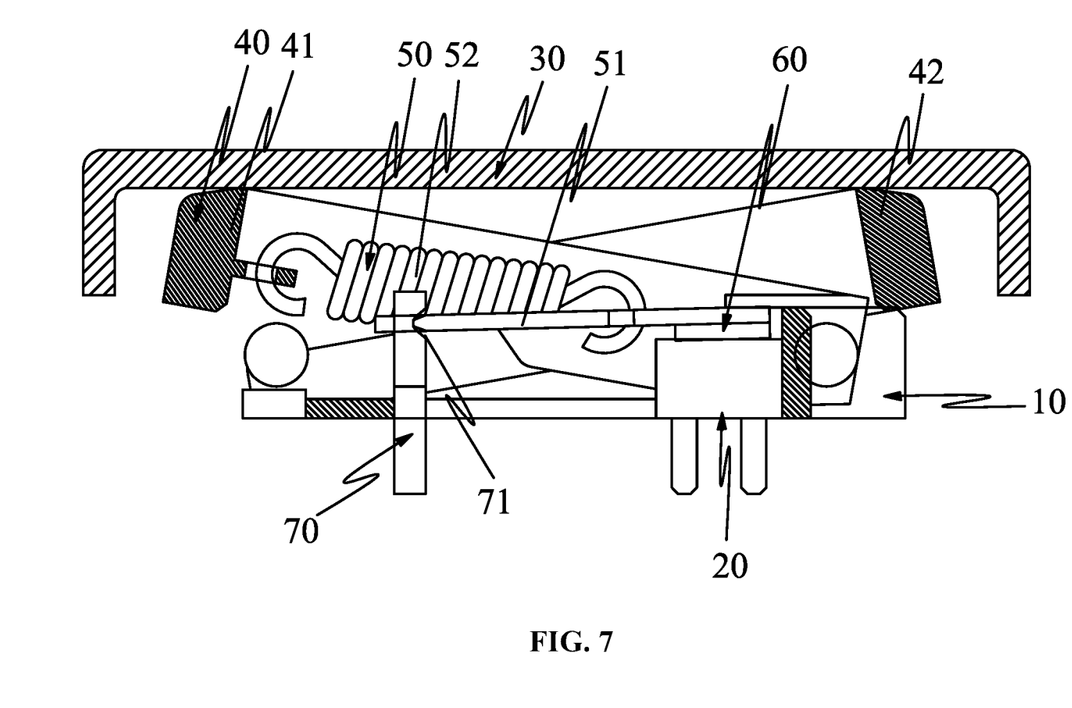
FIG. 7 is a schematic diagram of an ultrathin photoelectric switch in the off state in Example 4.
Figure 8:
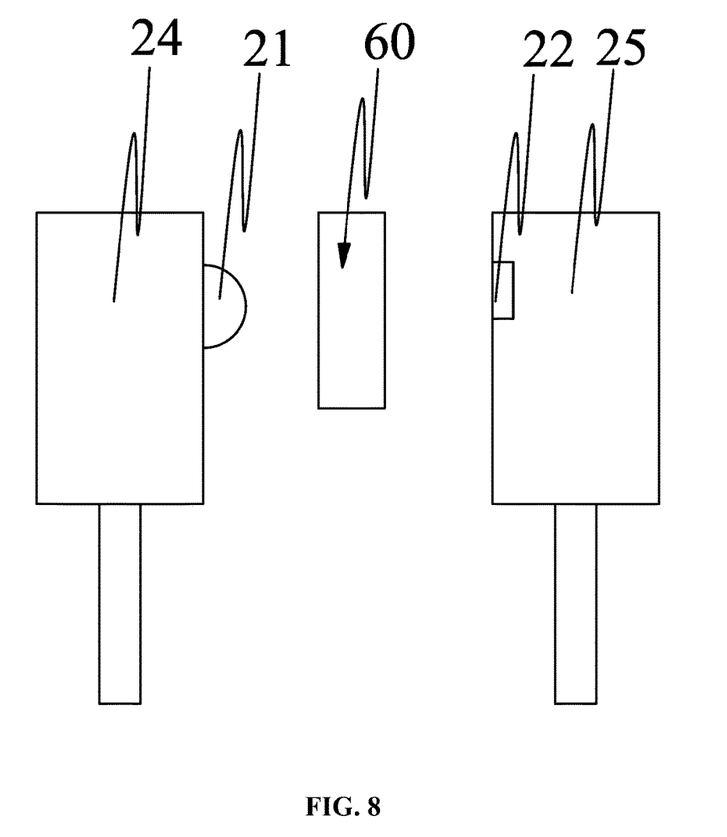
FIG. 8 is a diagram illustrating a working principle of a light-blocking member in FIG. 7.
Figure 9:
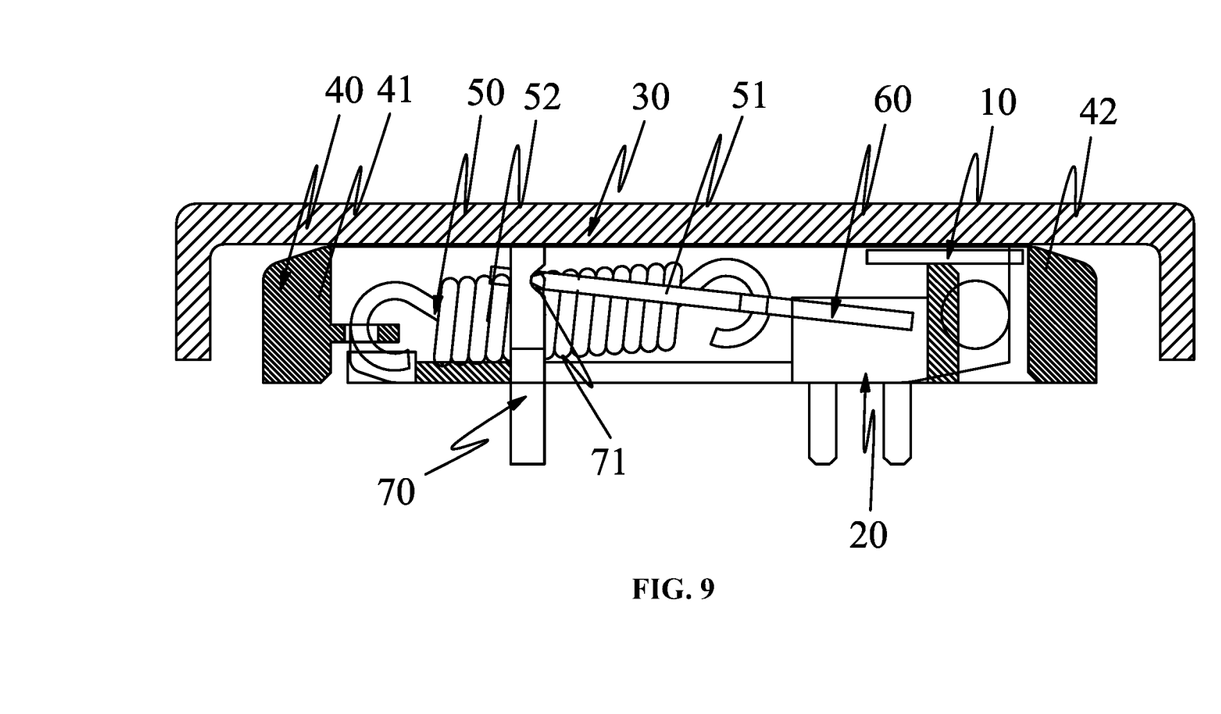
FIG. 9 is a schematic diagram of an ultrathin photoelectric switch in the on state in Example 4.
Figure 10:
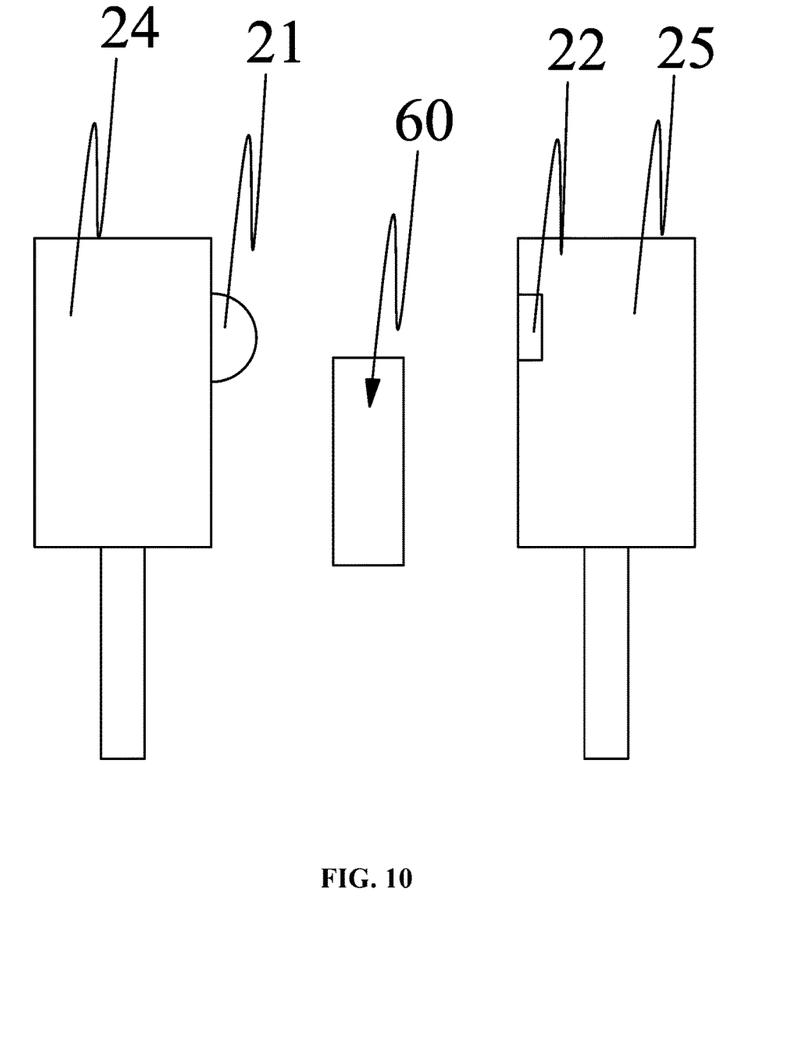
FIG. 10 is a diagram illustrating a working principle of a light-blocking member in FIG. 9.

In use, as shown in FIG. 7-8, the light-blocking member 60 is disposed between light-emitting tube 24 and the light-receiving tube 25. The infrared radiation emitted from the light-emitting end 21 is blocked by the light-blocking member 60, and is not received by the light-receiving end 22, the photoelectric switch is in the off state. As shown in FIG. 9-10, when the keycap 30 is pressed, the first frame 41 and the second frame 42 move downwards and overlap, meanwhile, the tension spring 52 is stretched, and the overturning member 51 is turned downwards. The light-blocking member 60 is turned downwards by the overturning member 51. The light-blocking member 60 no more blocks the infrared radiation, and the infrared radiation emitted from the light-emitting end 21 directly radiates to the light-receiving end 22. The light-receiving end 22 receives the infrared radiation, and the photoelectric switch is switched-on. When the keycap 30 is released, the tension spring 52 restores, and due to the restoration of the tension spring 52, the first frame 41 and the second frame 42 moves upwards, meanwhile, the keycap 30 is reset, and the light-blocking member 60 are reset together with the overturning member 51. The light-blocking member 60 once again disposed between the light-emitting tube 24 and the light-receiving tube 25. The infrared radiation emitted from the light-emitting end 21 can no longer be received by the light-receiving end 22, the photoelectric switch is in the off state once again.

Example 5

Figure 11:
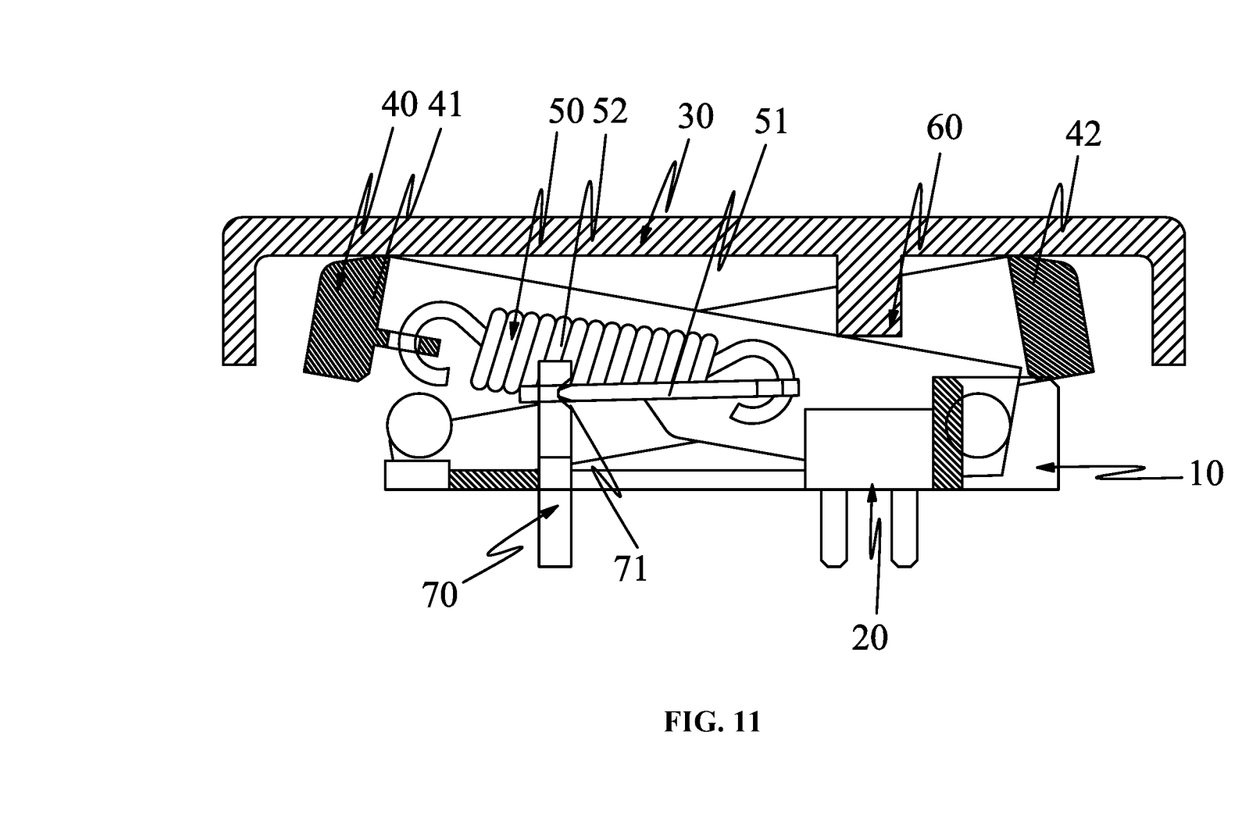
FIG. 11 is a schematic diagram of an ultrathin photoelectric switch in the off state in Example 5.
Figure 12:
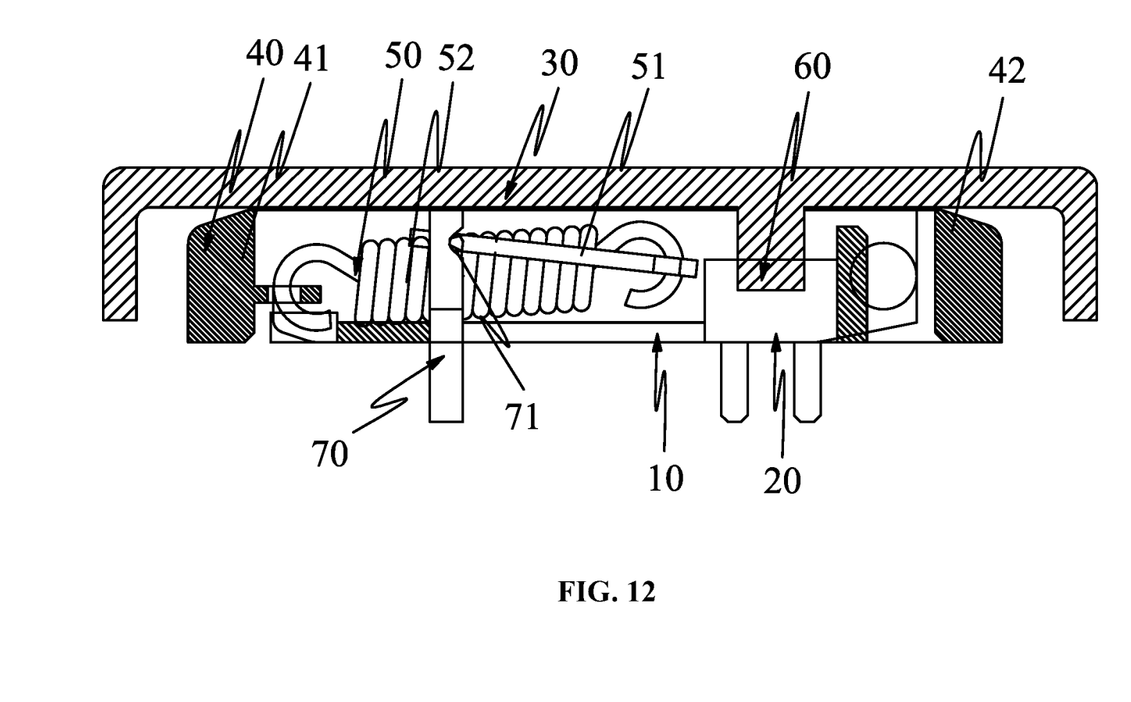
FIG. 12 is a schematic diagram of an ultrathin photoelectric switch in the on state in Example 5.

As shown in FIGS. 11-12, the example follows a basic structure in Example 4, except that the light-blocking member 60 is a protrusion of the bottom of the keycap 30 and is integrated with the keycap 30.

In use, as shown in FIG. 11, the light-blocking member 60 is disposed between light-emitting tube 24 and the light-receiving tube 25. The infrared radiation emitted from the light-emitting end 21 is not received by the light-receiving end 22, and the photoelectric switch is in the off state. As shown in FIG. 12, when the keycap 30 is pressed, the first frame 41 and the second frame 42 move downwards and overlap, meanwhile, the tension spring 52 is stretched, and the overturning member 51 is turned downwards. The light-blocking member 60 moves downwards with the keycap 30. The light-blocking member 60 no more blocks the infrared radiation, and the infrared radiation emitted from the light-emitting end 21 directly radiates to the light-receiving end 22. The light-receiving end 22 receives the infrared radiation, and the photoelectric switch is switched-on. When the keycap 30 is released, the tension spring 52 restores, and due to the restoration of the tension spring 52, the first frame 41 and the second frame 42 moves upwards, meanwhile, the keycap 30 is reset, and the light-blocking member 60 are reset together with the keycap 30. The light-blocking member 60 once again disposed between the light-emitting tube 24 and the light-receiving tube 25. The infrared radiation emitted from the light-emitting end 21 can no longer be received by the light-receiving end 22, the photoelectric switch is in the off state once again.

Example 6

Figure 13:
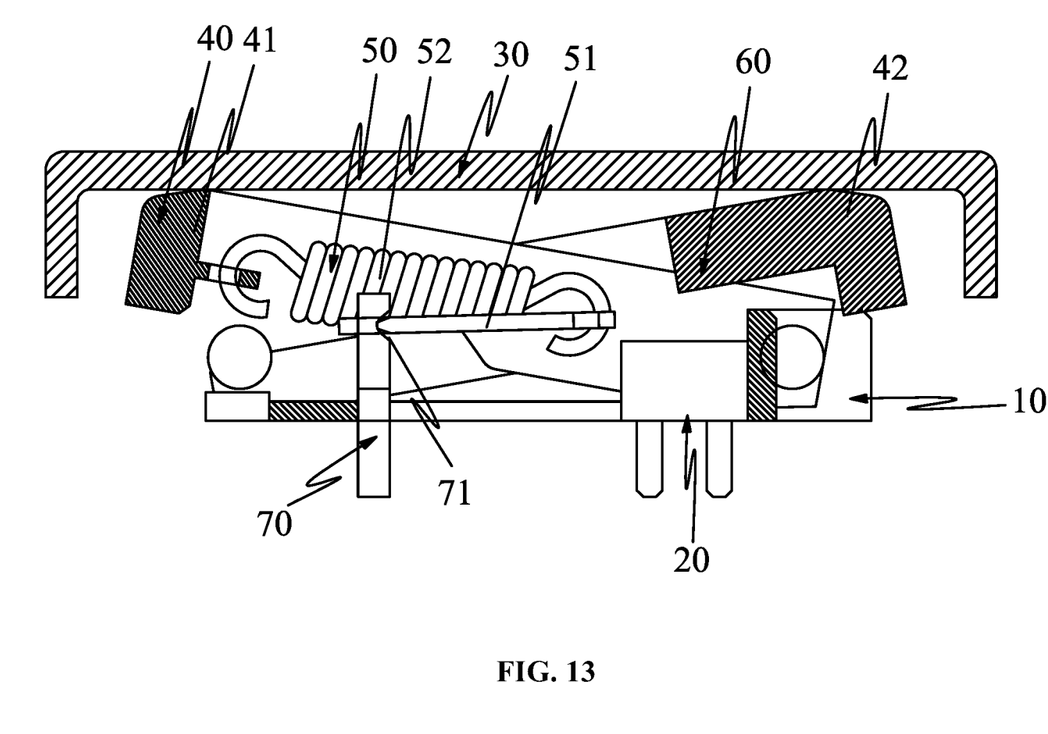
FIG. 13 is a schematic diagram of an ultrathin photoelectric switch in the off state in Example 6.
Figure 14:
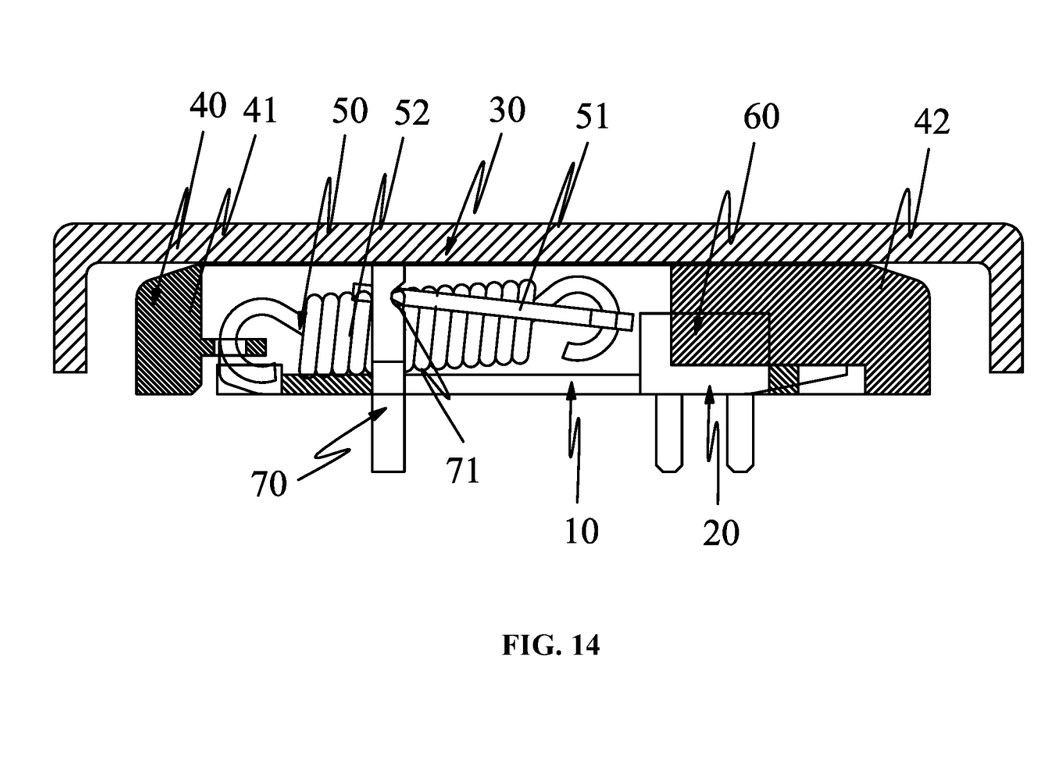
FIG. 14 is a schematic diagram of an ultrathin photoelectric switch in the on state in Example 6.

As shown in FIGS. 13-14, the example follows a basic structure in Example 4, except that the light-blocking member 60 is integrated with the balance frame 40.

In use, as shown in FIG. 13, the light-blocking member 60 is disposed between light-emitting tube 24 and the light-receiving tube 25. The infrared radiation emitted from the light-emitting end 21 is not received by the light-receiving end 22, the photoelectric switch is in the off state. As shown in FIG. 14, when the keycap 30 is pressed, the first frame 41 and the second frame 42 move downwards and overlap, meanwhile, the tension spring 52 is stretched, and the overturning member 51 is turned downwards. The light-blocking member 60 moves downwards with the balance frame 40. The light-blocking member 60 no more blocks the infrared radiation, and the infrared radiation emitted from the light-emitting end 21 directly radiates to the light-receiving end 22. The light-receiving end 22 receives the infrared radiation, and the photoelectric switch is switched-on. When the keycap 30 is released, the tension spring 52 restores, and due to the restoration of the tension spring 52, the first frame 41 and the second frame 42 moves upwards, meanwhile, the keycap 30 is reset, and the light-blocking member 60 are reset together with the balance frame 40. The light-blocking member 60 once again disposed between the light-emitting tube 24 and the light-receiving tube 25. The infrared radiation emitted from the light-emitting end 21 can no longer be received by the light-receiving end 22, the photoelectric switch is in the off state once again.

The key point in the design of the invention is that: a light-blocking member is used to change the propagation direction of the light and control the connection and the disconnection of the infrared tube. The method that the movable contact piece is connected to static contact piece in the prior art is replaced, thus the bad contact caused by oxidization of the contact pieces is effectively avoided. The stability of the switching is improved, and the service life of the photoelectric switch is prolonged. The balance frame is used to equalize the compression on the keycap. The light-blocking member is driven by the keycap, the balance frame, and the resetting mechanism, and the conventional guide pin is abandoned, thus the photoelectric switch is thin. In addition, no matter which place the finger of users presses on the keycap, the balance frame can equalize the compression on the keycap through linkage control, thus the motion of the light-blocking member is accurate and sensitive, so the photoelectric switch is easy to use.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A photoelectric switch, comprising:
   a base;
   an infrared tube, the infrared tube comprising a light-emitting end and a light-receiving end;
   a keycap;
   a balance frame;
   a resetting mechanism; and
   a light-blocking member being configured to change a propagation direction of light emitted from the infrared tube to allow or block light propagation in the infrared tube;
wherein:
   the infrared tube is disposed on the base;
   the infrared tube, the balance frame, and the resetting mechanism are disposed beneath and covered by the keycap;
   in operation, upon being pressed by an external force, the balance frame leads the keycap to move downwards; the light-blocking member moves upwards with the motion of the keycap, the balance frame, or the resetting mechanism; or the light-blocking member moves downwards with the motion of the keycap, the balance frame, or the resetting mechanism;
   the resetting mechanism is configured to reset the keycap or the balance frame; and
   the base comprises a support body; the infrared tube and the support body are disposed on the base separately; an upper end of the support body is provided with a fulcrum slot; the balance frame comprises a first frame and a second frame; the first frame and the second frame are crisscrossed and articulated; a lower end of the first frame and a lower end of the second frame are respectively articulated with two ends of the base; an upper end of the first frame and an upper end of the second frame are respectively articulated with two ends of a bottom of the keycap; the resetting mechanism comprises an overturning member and a tension spring; one end of the overturning member butts against the fulcrum slot; the overturning member is capable of turning over relative to the support body; one end of the tension spring is connected to the other end of the overturning member, and the other end of the tension spring is connected to the upper end of the first frame.

2. The photoelectric switch of claim 1, wherein the light-blocking member is formed by extension of the overturning member and is integrated with the overturning member.

3. The photoelectric switch of claim 1, wherein the light-blocking member is a protrusion of the bottom of the keycap and is integrated with the keycap.

4. The photoelectric switch of claim 1, wherein the light-blocking member is a protrusion of the balance frame and is integrated with the balance frame.

5. The photoelectric switch of claim 1, wherein the infrared tube is a refractive infrared tube; the light-emitting end and the light-receiving end are encapsulated in a main body; and the light-blocking member is disposed above the main body and is capable of moving up and down.

6. The photoelectric switch of claim 1, wherein the infrared tube is a correlative infrared tube; the infrared tube comprises a light-emitting tube and a light-receiving tube; the light-emitting end is disposed on the light-emitting tube, and the light-receiving end is disposed on the light-receiving tube; and the light-blocking member is disposed between the light-emitting tube and the light-receiving tube and is capable of moving up and down.

* * * * *